United States Patent [19]

Matsuoka et al.

[11] Patent Number: 5,628,645
[45] Date of Patent: May 13, 1997

[54] IC SOCKET

[75] Inventors: Noriyuki Matsuoka, Yokohama; Kazumi Uratsuji, Tokyo, both of Japan

[73] Assignee: Yamaichi Electronics Co., Ltd., Tokyo, Japan

[21] Appl. No.: 445,225

[22] Filed: May 18, 1995

[30] Foreign Application Priority Data

May 18, 1994 [JP] Japan .................. 6-128294

[51] Int. Cl.$^6$ .................. H01R 13/62
[52] U.S. Cl. .................. 439/331; 439/259
[58] Field of Search .................. 439/68–73, 259–270, 439/330, 331

[56] References Cited

U.S. PATENT DOCUMENTS

| 4,031,295 | 6/1977 | Rigazio | 429/96 |
|---|---|---|---|
| 4,498,047 | 2/1985 | Hexamer et al. | 439/72 |
| 4,623,208 | 11/1986 | Kerul et al. | 439/72 |
| 4,669,796 | 6/1987 | Carter | 439/372 |
| 4,832,610 | 5/1989 | Matsuoka | 439/68 |
| 4,846,703 | 7/1989 | Matsuoka et al. | 439/71 |
| 4,846,704 | 7/1989 | Ikeya | 439/72 |
| 4,886,470 | 12/1989 | Billman et al. | 439/266 |
| 5,009,609 | 4/1991 | Matsuoka et al. | 439/73 |
| 5,076,798 | 12/1991 | Uratsuji | 439/269 |
| 5,186,641 | 2/1993 | Uratsuji | 439/266 |
| 5,195,903 | 3/1993 | Uratsuji | 439/266 |
| 5,290,192 | 3/1994 | Espenshade et al. | 439/266 |
| 5,299,948 | 4/1994 | Matsuoka | 439/331 |
| 5,304,072 | 4/1994 | Kunioka et al. | 439/266 |
| 5,328,383 | 7/1994 | Savant | 439/331 |
| 5,368,497 | 11/1994 | Nagumo | 439/331 |

FOREIGN PATENT DOCUMENTS

| 4-154065 | 5/1992 | Japan . |
|---|---|---|
| 2119173 | 3/1983 | United Kingdom . |

Primary Examiner—Hien Vu
Attorney, Agent, or Firm—Wenderoth, Lind & Ponack

[57] ABSTRACT

An IC socket includes a socket body, an IC package receiving portion formed in the socket body and adapted to receive an IC package therein, a plurality of contacts arranged in array along the IC package receiving portion, and a contact opening/closing cover overlying the socket body. The contacts are displaced between a position for contacting leads of the IC package and a position for removing the contacting relation upon upward and downward movements of the contact opening/closing cover. The IC socket further includes a positioning member which is displaced in the same direction as the contacts in upon the upward and downward movements of the contact opening/closing cover, so as to regulate the portions of the contacts in the neighborhood of a contacting portion of each contact.

20 Claims, 12 Drawing Sheets

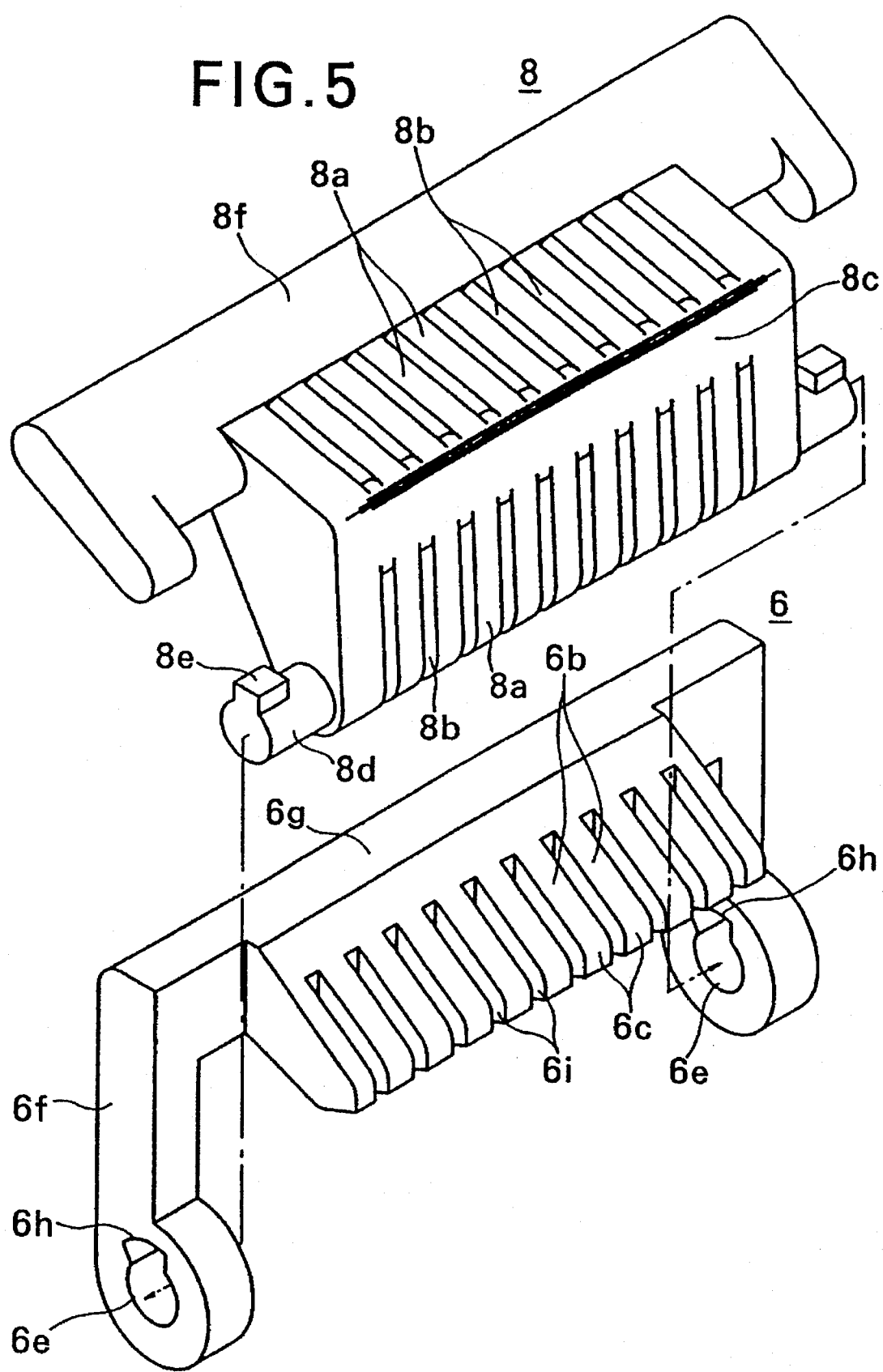

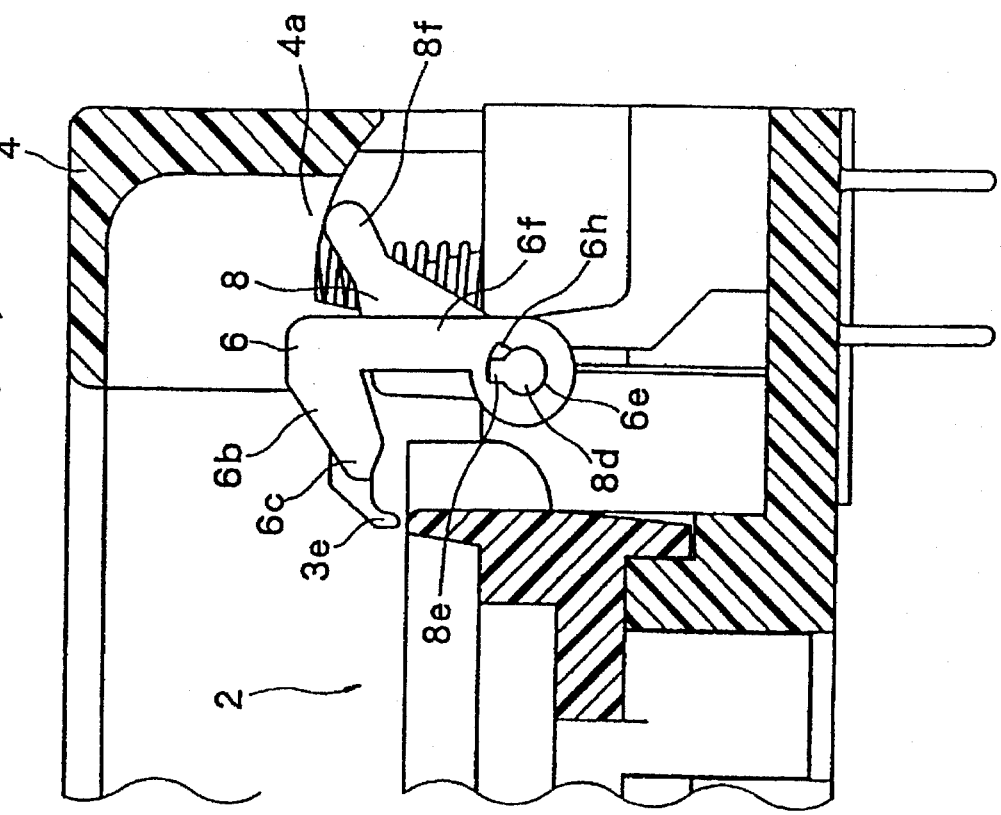
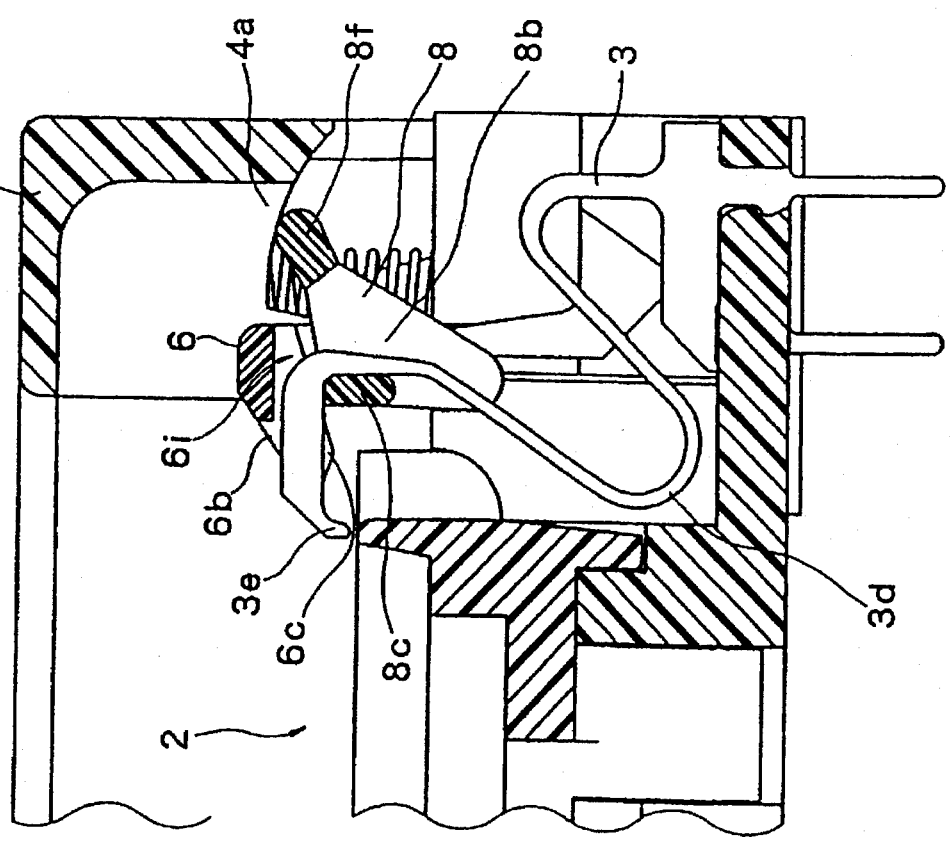
FIG.7(A1)
FIG.7(A2)

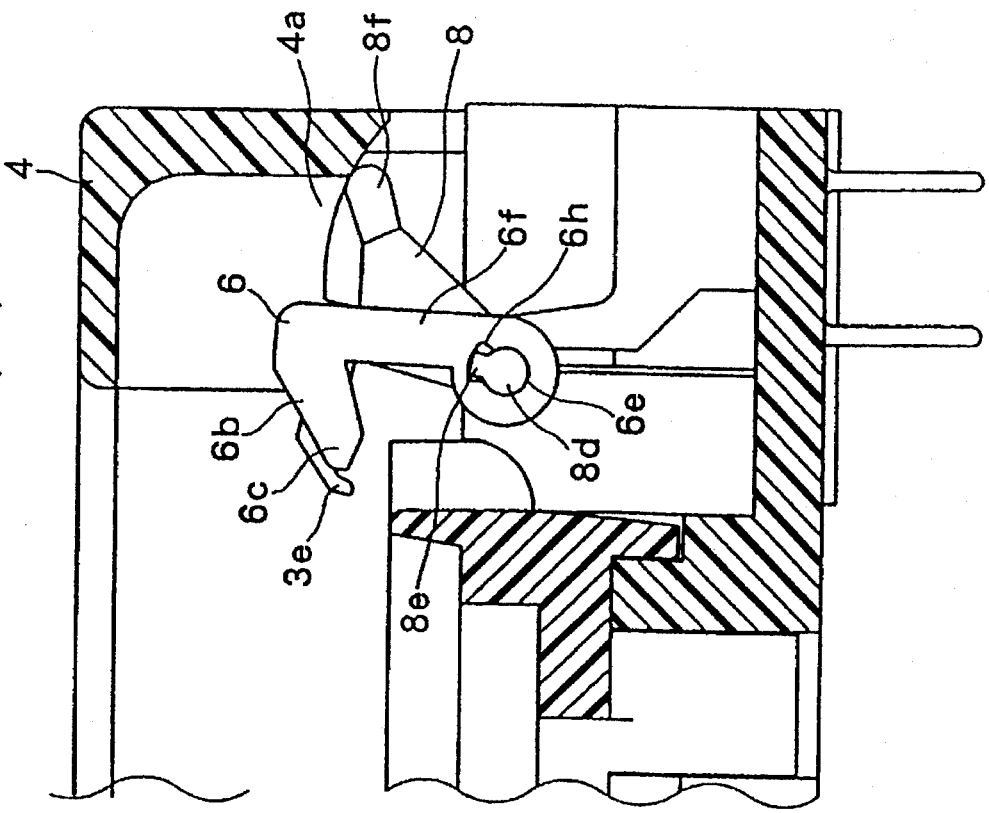
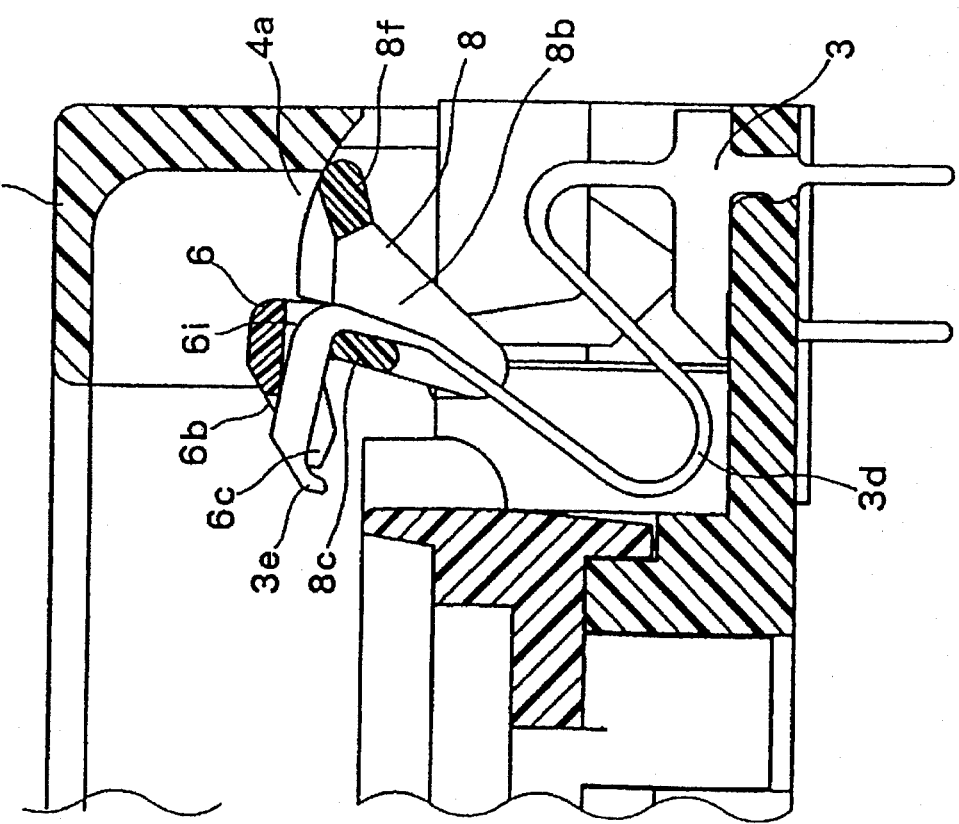

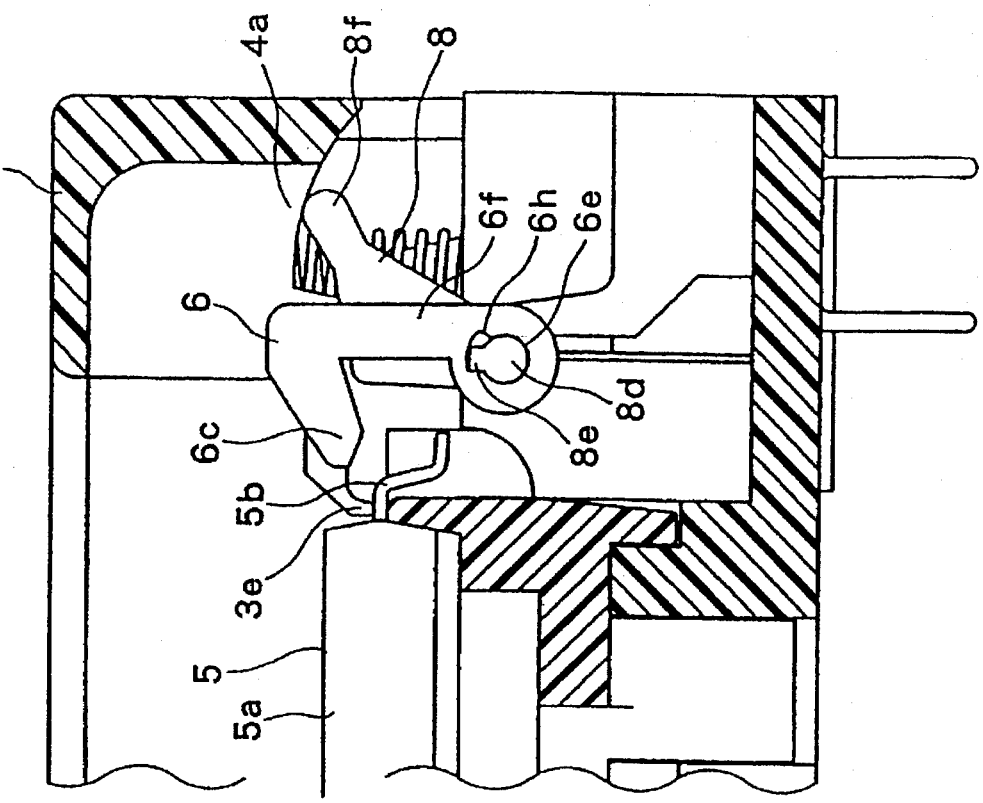
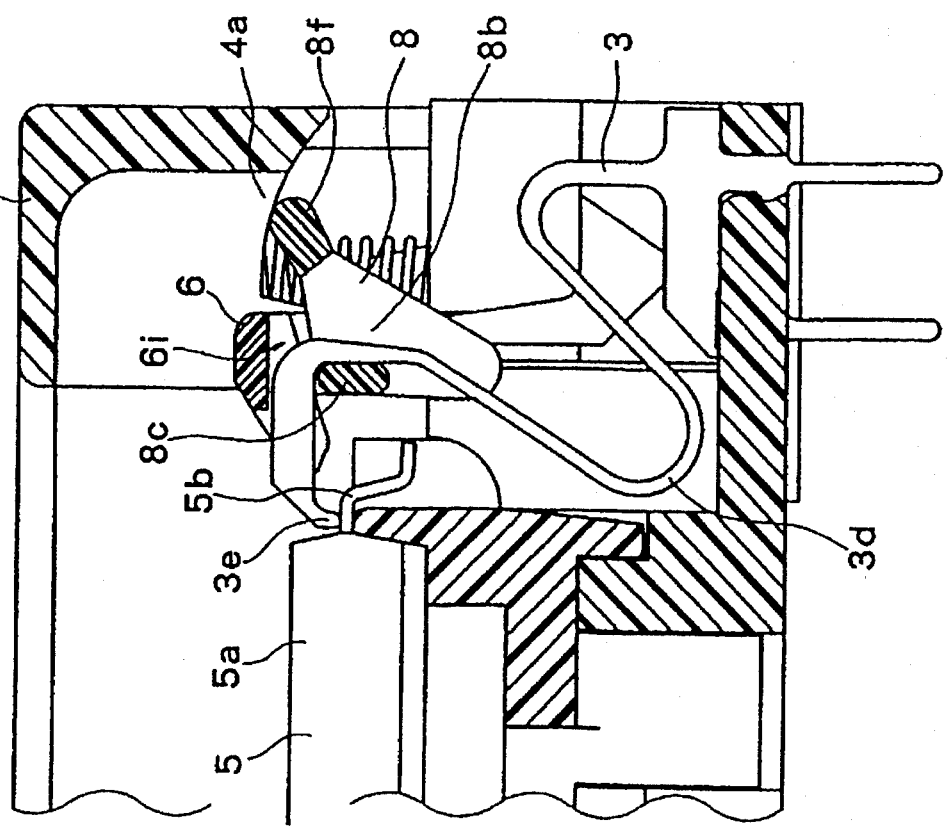

IC SOCKET

BACKGROUND OF THE INVENTION

1. Field of the Invention

This invention relates to an IC socket in which contacts are displaced by a contact opening/closing cover so that they are brought into and out of contact with leads of an IC package, and more particularly to a contact positioning structure in the IC socket.

2. Brief Description of the Prior Art

As a conventional IC socket, there is known a device as disclosed, for example, in U.S. Pat. No. 5,009,609 and others, in which an IC package is received in an IC package receiving portion of a socket body from above, and contacts are displaced between a position for contacting leads of the IC package and a position for removing the contact relation, in response to upward and downward motion of a contact opening/closing cover.

In the above-mentioned conventional IC socket, the cover is lowered to displace the contacts rearwardly to a contact-relation removing position, so that the IC package is received in the IC package receiving portion, and the cover is raised to displace the contacts forwardly to a contacting position, so that the contacts are brought into contact with the IC leads. When the contacts are displaced forwardly and backwardly, twisting and/or side slip tends to occur. This results in poor electrical connection between the contacts and the leads.

Also, in the above prior art, in order to obviate the poor electrical connection, a positioning member integral with the socket body is disposed at location in the vicinity of the area where the IC lead and the contact are contacted with each other. The positioning member is adapted to correctly position the contacts. When the IC package is received in the IC package receiving portion of the socket body from above, if the positional alignment between the IC package and the socket body is not sufficient, there is a possibility that the IC leads of the IC package will contact the positioning members and the IC leads will be deformed.

Further, in order to prevent the twisting and/or side slip when the contacts are displaced forwardly and backwardly, the contact portion of each contact must be correctly positioned by the positioning member even at the time the contact is in its backward position. Consequently, the positioning member becomes inevitably large in size, very thin and high.

SUMMARY OF THE INVENTION

It is, therefore, an object of the present invention to provide an IC socket, in which contacts can be correctly positioned in order to realize a reliable electrical connection between the contacts and IC leads.

According to the present invention, there is essentially provided, in order to achieve the above object, an IC socket comprising a socket body, an IC package receiving portion formed in the socket body and adapted to receive an IC package therein, a plurality of contacts arranged in array along the IC package receiving portion, and a contact opening/closing cover overlying the socket body, the contacts being displaced between a position for contacting leads of the IC package and a position for removing the contacting relation in accordance with upward and downward movements of the contact opening/closing cover, wherein the IC socket further comprises a positioning member, the positioning member being displaced in the same direction as the contacts in accordance with the upward and downward movements of the contact opening/closing cover, so as to regulate the neighborhood of a contacting portion of each contact.

With the construction of the IC socket according to the present invention, when a contact opening/closing cover is lowered, the contact and the positioning member are displaced rearwardly to a location where they do not interfere with the IC package, in response to the downward motion of the cover. In that condition, the IC package is received in the IC package receiving portion. When the contact opening/closing cover is raised upwardly to displace the contact forwardly from the contact-relation removing position to the contacting position, the positioning member is displaced forwardly to correctly position the neighborhood of the contacting portion of the contact. As a consequence, the contact is correctly contacted with the lead of the IC package.

Various advantages and features which characterize the present invention are pointed out with particularity in the claims annexed hereto and which form a part hereof. However, for a better understanding of the present invention, its advantages, and objects attained by its use, reference should be had to the drawings, which form a further part hereof, and to the accompanying descriptive matter, in which there is illustrated and described a preferred embodiment of the present invention.

BRIEF DESCRIPTION OF THE DRAWINGS

FIG. 5 is an exploded perspective view of a contact opening/closing lever and a contact regulating lever according to a third embodiment of the present invention;

FIGS. 7(A1) and 7(A2) are partial sectional views showing operating states in different sectional positions of the contact and the contact opening/closing lever in the IC socket according to the third embodiment;

FIG. 8(B1) is a partial sectional view of the IC socket for explaining the operating state which follows that of FIG. 7(A1), and FIG. 8(B2) is a partial sectional view of the IC socket for explaining the operating state which follows that of FIG. 7(A2);

FIG. 11(E1) is a partial sectional view of the IC socket for explaining the operating state which follows that of FIG.

Figure 10:
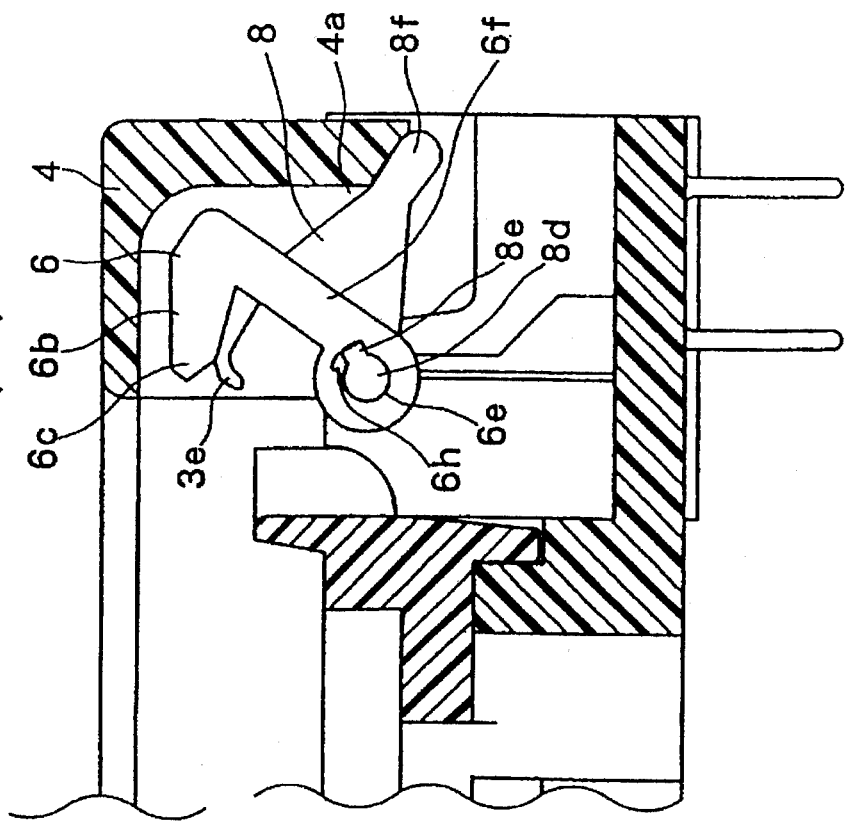
FIG. 10(D1) is a partial sectional view of the IC socket for explaining the operating state which follows that of FIG. 9(C1), and FIG. 10(D2) is a partial sectional view of the IC socket for explaining the operating state which follows that of FIG. 9(C2)
Figure 10:
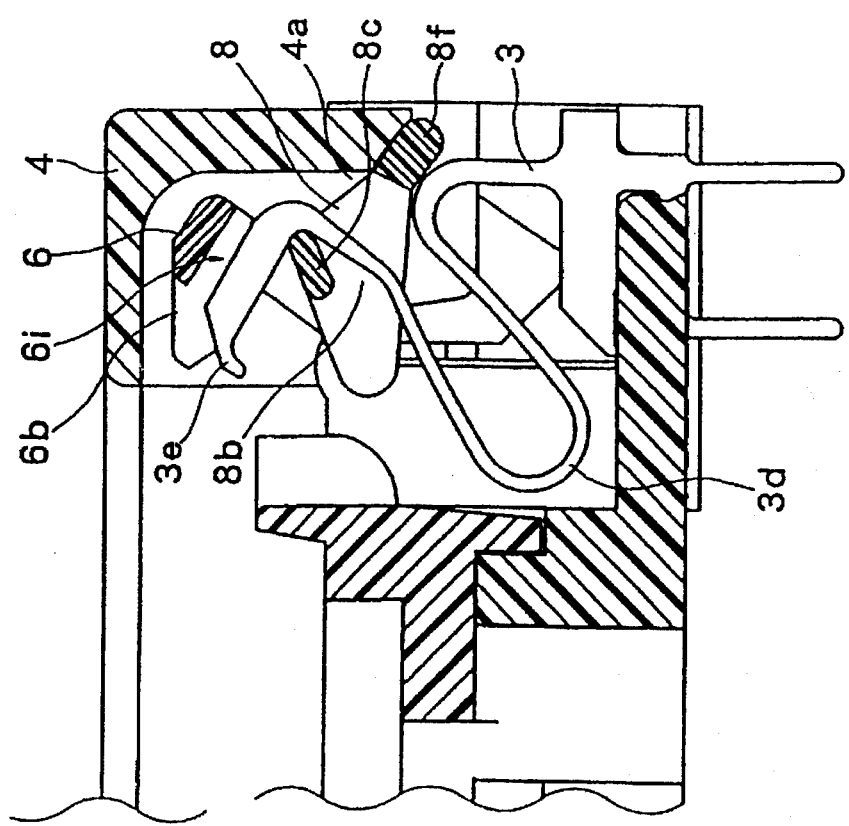
Figure 12:
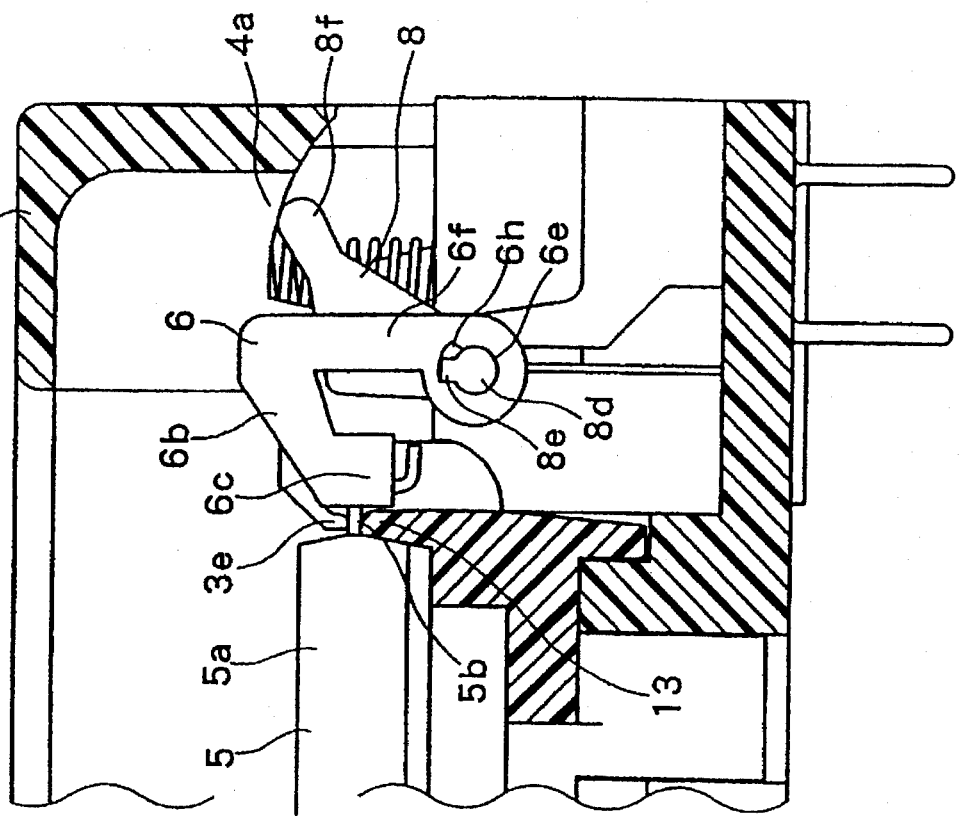
Figure 12:
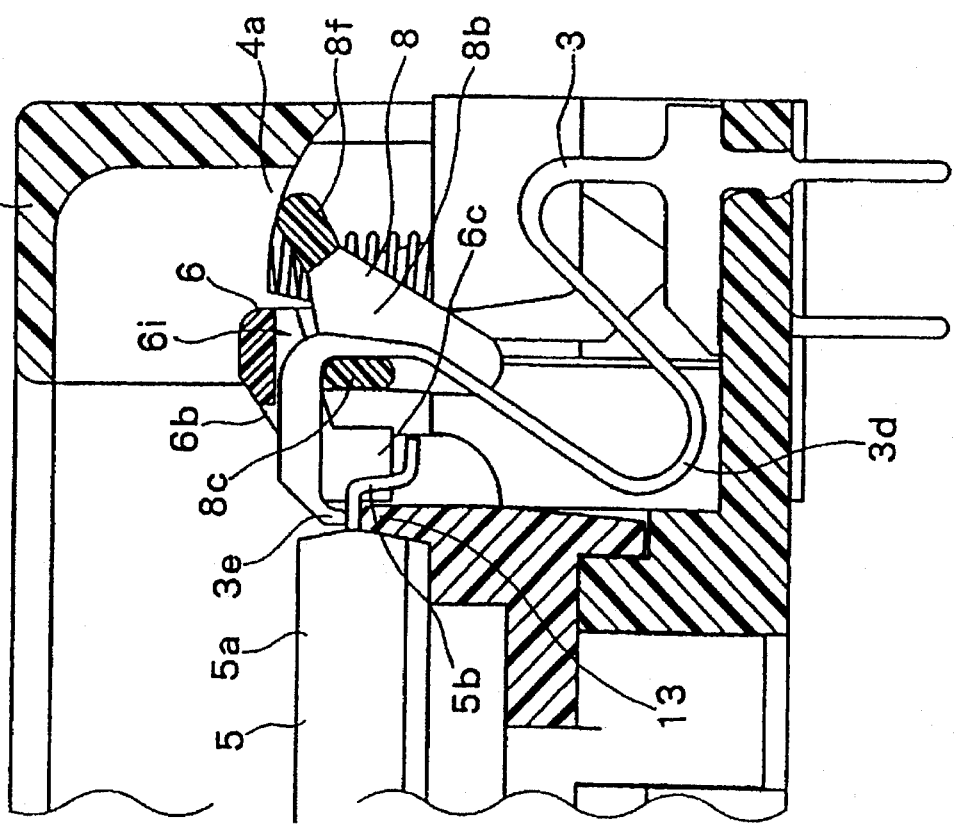
Figure 13:
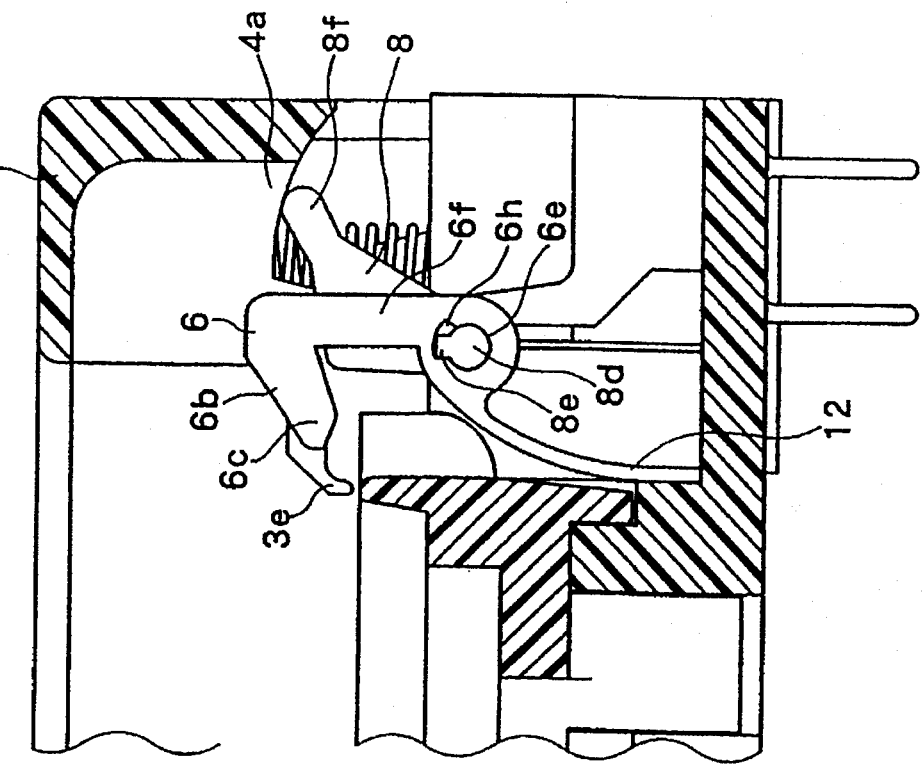
Figure 14:
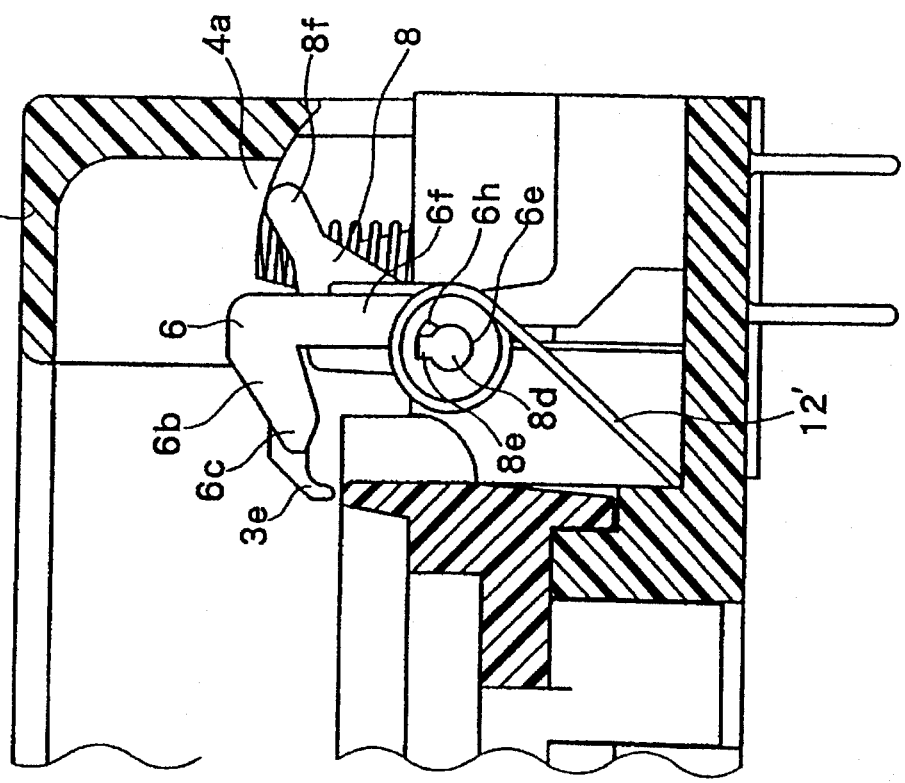

10(D1), and FIG. 11(E2) is a partial sectional view of the IC socket for explaining the operating state which follows that of FIG. 10(D2);

FIGS. 12(A1) and 12(A2) are partial sectional views showing an IC socket in different sectional positions according to a fourth embodiment of the present invention;

FIG. 13 is a partial sectional view showing a modified form of the contact regulating lever of the third and fourth embodiments; and FIG. 14 is a partial sectional view showing another modified embodiment of the contact regulating lever in the third and fourth embodiments.

DETAILED DESCRIPTION OF THE EMBODIMENTS

Figure 1:
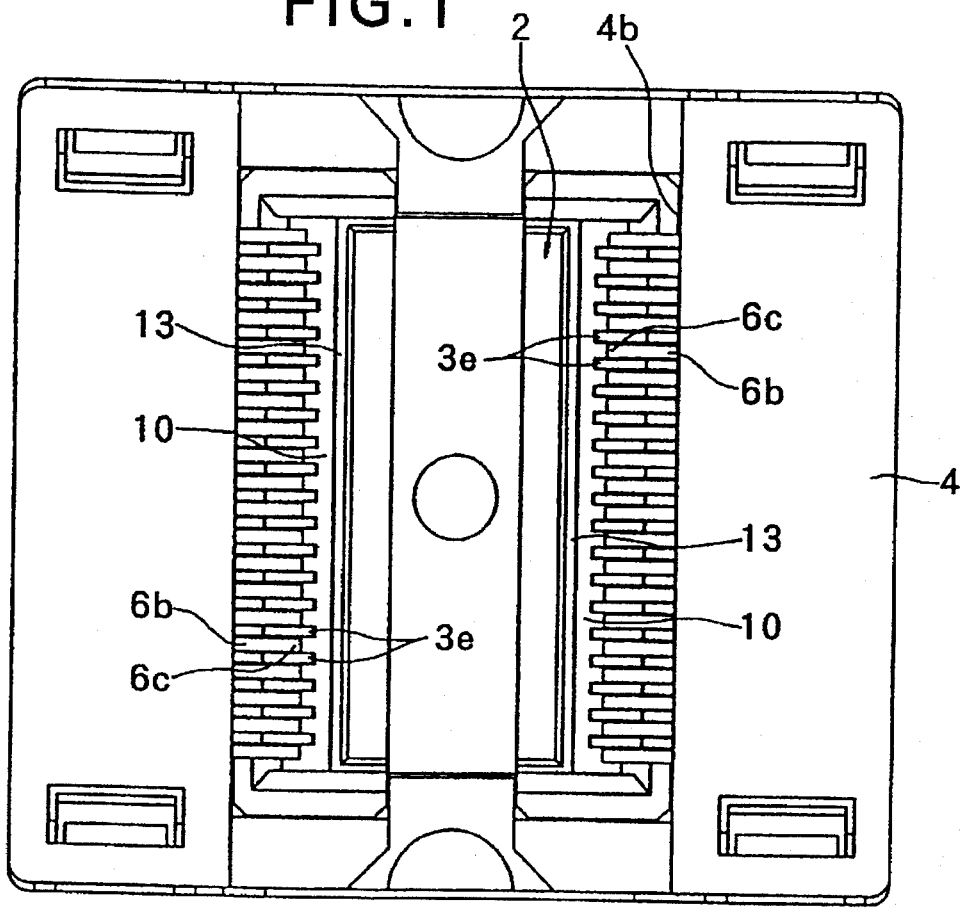
FIG. 1 is a plan view of an IC socket according to a first embodiment of the present invention.
Figure 2:
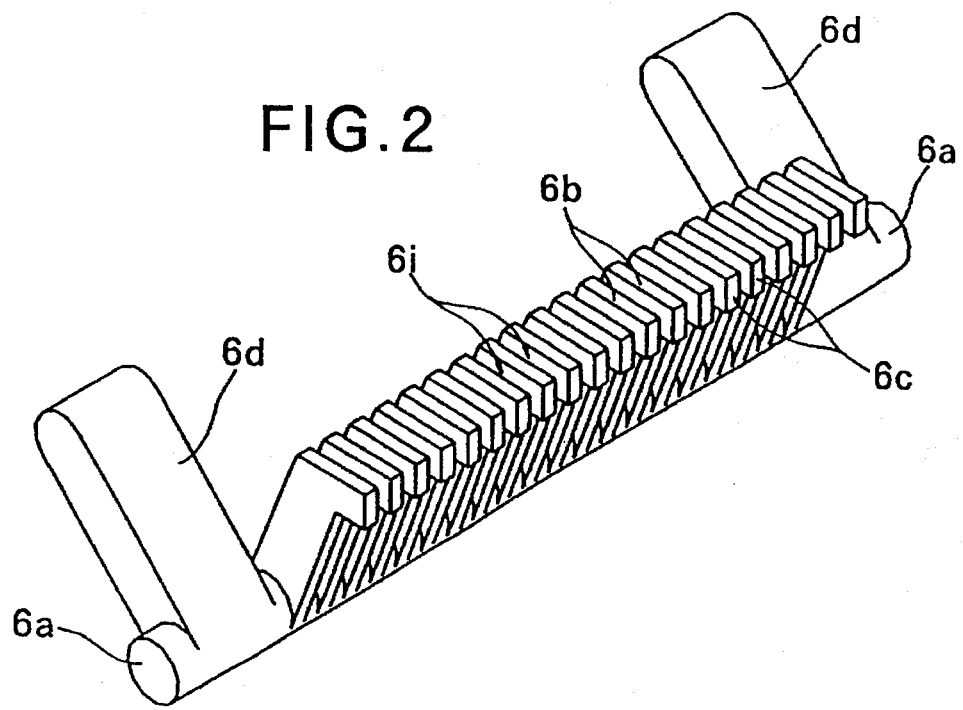
FIG. 2 is a perspective view of a contact regulating lever the IC socket of FIG. 1.

In FIGS. 1 to 3, an insulative socket body 1 formed of a resin includes a generally square IC receiving portion 2 opening upwardly and an array of contacts 3 arranged along at least two opposing sides of the IC receiving portion 2. The IC receiving portion 2 is formed in a central portion of the socket body 1 and adapted to receive an IC package 5. The array of contacts 3 correspond to leads 5b of an IC package 5. The socket body 1 further includes a contact opening/closing cover 4. The cover 4 overlies the socket body 1 and is adapted to displace the contacts 3 from a position for contacting the IC leads 5b to a position for removing the contacting relation.

This contact opening/closing cover 4 overlies the socket body 1 and is movable upwardly and downwardly. The cover 4 coacts with the contact 3 and a positioning member as later described. The cover 4 has a window 4b corresponding to the IC receiving portion 2. The IC package 5 is received in the IC receiving portion 2 through this window 4b.

Figure 3B:
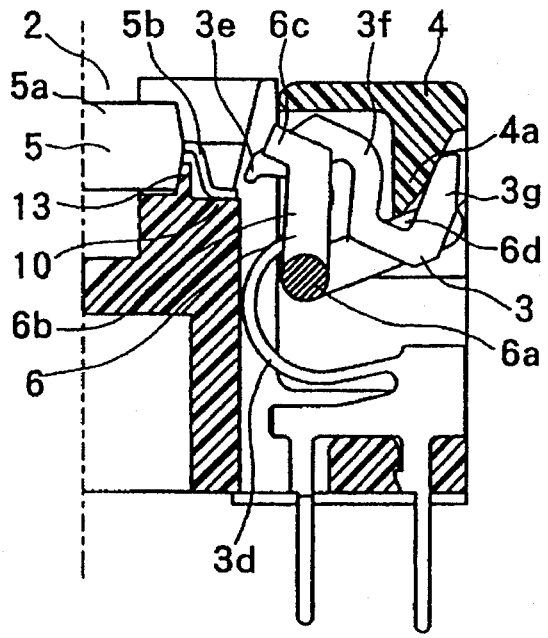
FIGS. 3(A), 3(B) and 3(C) are partial sectional views for explaining the operating states between a contact and the contact regulating lever in the IC socket of FIG. 1.
Figure 3A:
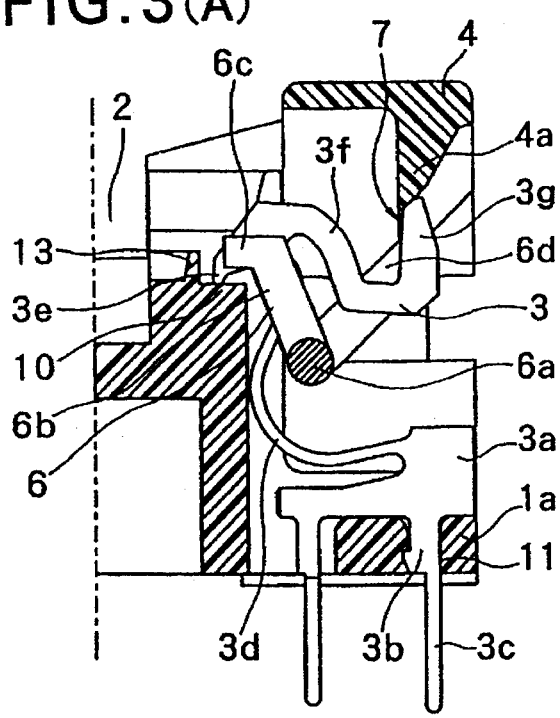
Figure 3C:
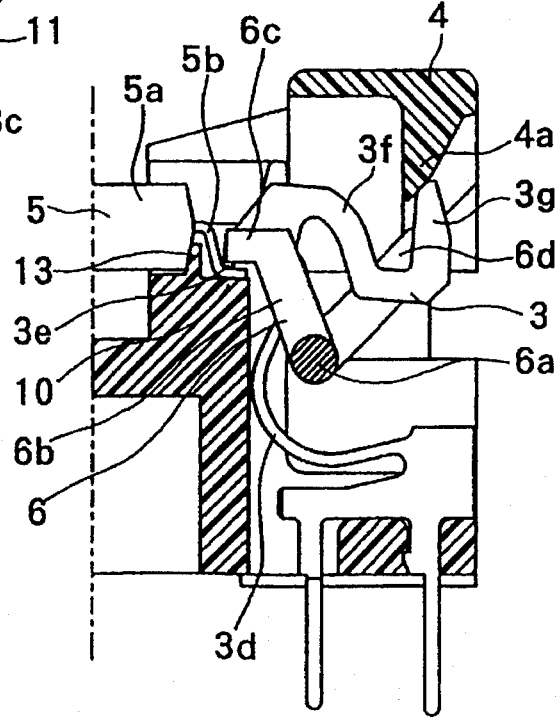

In the IC receiving portion 2, a rib 13 is disposed at an inner side of and in parallel with each array of the contacts 3. As shown in FIGS. 3(A)–3(C), the rib 13 regulates a side surface of the IC package body 5a from which the leads 5b project. A distal end portion of the crab-leg like double bent lead 5a of the IC package 5 is placed on a lead support surface 10 which is formed on an outer side of the rib 13.

The contacts 3 are arranged in an array along the outer side of the lead support surface 10. Each contact 3 includes a support plate portion 3a which is supported on an upper surface of a contact implanting portion 1a of the socket body 1. The contact 3 is implanted by forcing a press-in portion 3b projecting downwardly from the support plate portion 3a into a contact press-in hole 11 formed in the socket body 1. The contact 3 further includes a terminal portion 3c projecting downwardly from the support portion 3a. The press-in portion 3b is formed at a base end portion of the terminal portion 3c.

The contact 3 further includes a curved spring portion 3d and a contacting portion 3e. The curved spring portion 3d projects forwardly (IC receiving portion 2 side) from an upper portion of the support plate portion 3a. The contacting portion 3e projects from the upper end of the curved spring portion 3d above the lead support surface 10 and then forwardly and diagonally downwardly toward the lead support surface 10. The portion of the contact 3 in the neighborhood of this contacting portion 3e is regulated by a contact regulating lever 6 which forms a contact positioning means as later described.

The contact 3 further includes a cantilever arm portion 3f and a pressure receiving portion 3g. The arm portion 3f extends rearwardly from a connection portion between the contacting portion 3e and the spring portion 3d. The pressure receiving portion 3g is bent upwardly from an end portion of the arm portion 3f. The pressure receiving portion 3g is disposed opposite to a pressing portion 4a of the contact opening/closing cover 4.

As shown in FIGS. 1, 2 and 3, the contact regulating levers 6 extend along and in parallel relation to the two opposing sides of the IC receiving portion 2, i.e., two opposing arrays of contacts 3, and each has a shaft portion 6a extending in the same direction. Opposite ends of the shaft portion 6a are rotatably supported by the socket body 1.

As shown in FIGS. 3(A)–3(C), for example, the shaft portion 6a extends along the back of the curved spring portion 3d below the arm 3f, i.e., within a concavely curved area of the spring portion 3d. The shaft portion 6a has a plurality of separate fins 6b. The separate fins 6b project from the shaft portion 6a so as to be interposed between adjacent contacts 3. A regulating piece 6c is formed on a free end of each separate fin 6b so as to be interposed between the contacting portions 3e of adjacent contacts 3.

In other words, a slit 6i is formed between adjacent separate fins 6b so as to receive the contacting portion 3e of the contact 3.

More specifically, the separate fins 6b are arranged over the entire length of the shaft portion 6a and extend in a direction perpendicular to the shaft portion 6a. The separate fins 6b are arranged, side by side, at intervals equal to those of the contacts 3 such that each fin 6b exists between adjacent contacts (the arrangement of the separate fins 6b is positionally displaced by a half pitch with respect to the arrangement of the contacts). The separate fins 6b extend forwardly and upwardly at angles from the shaft portion 6a. The regulating piece 6c formed on the free end of each separate fin 6b is displaced to a position for interfering with the IC lead 5b in order to regulate the contacting portion 3e when the IC package 5 is inserted into and removed from the IC receiving portion 2.

Each contact regulating lever 6 has pressure receiving arms 6d. The arms 6d extend obliquely upwardly from opposite ends of the shaft portion 6a at a predetermined angle with the separate fins 6b. An end portion of each pressure receiving arm 6d is disposed opposite to the pressing portion 4a of the contact opening/closing lever 4.

In the state of FIG. 3(A), when the contact opening/closing cover 4 is depressed to cause the pressing portion 4a to push down the pressure receiving portion 3g against the resiliency of the curved spring portion 3d, the contacting portion 3e of the contact 3 is moved upwardly and rearwardly against the resiliency of the curved spring portion 3d. As a consequence, the contacting portion 3e is displaced to a contact-relation removing position where the contacting portion 3e does not interfere with the IC package 5 which is being received in the IC receiving portion 2. This contact-relation removing position can also be referred to as a standby position.

Also, when the contact opening/closing cover 4 is depressed to cause the pressing portion 4a to push down the pressure receiving arm 6d, the separate fins 6b are pivoted upwardly and rearwardly about the shaft portion 6c and brought to a position where the separate fins 6b do not interfere with the IC package 5 which is being received in the IC receiving portion 2. As a consequence, the IC receiving portion 2 is opened as shown in FIG. 3(B).

In that state, the IC package 5 is loaded in the IC receiving portion 2. The body 5a of the IC package 5 is placed between the ribs 13 and the side surfaces of the body 5a are regulated by the ribs 13. At the same time, the distal ends of the leads 5b are received on the lead support surface 10. By doing this, the IC package 5 is received in the IC receiving portion 2 (FIG. 3(B)).

Thereafter, when the depressive force to the contact opening/closing cover 4 is removed, the contact opening/closing cover 4 is raised by the restoring resiliency of the curved spring 4 is raised by the restoring resiliency of the curved spring portions 3d. During the course of the contact opening/closing cover 4 thus being raised, the contacting portion 3e of the contact 3 id displaced, as shown in FIG. 3(C), downwardly and forwardly from the contact-relation removing position (standby position) to the contacting position. The separate fins 6b of the position lever 6 are also pivoted downwardly and forwardly from the standby position. As a consequence, the positions of the side surfaces of the contacting portions 3e are regulated by the separate fins 6b, and the contacting portions 3e are brought to the distal end portions of the leads 5b which are placed on the lead support surface 10. In this manner, the contacting portions 3e of the contacts 3 are contacted against the upper surface of the distal end portions of the leads 5b under an appropriate pressure.

As mentioned above, the separate fins 6b, which are interposed between adjacent contacting portions 3e, are displaced forwardly together with the contacting portions 3e. Consequently, twisting and slipping of the contacting portions 3e are prevented during the time the contacting portions 3e are displaced forwardly so as to contact the leads 5b, thereby ensuring a correct electrical connection with the leads 5b.

In the above embodiment, as showing FIG. 3(C), the regulating piece 6c formed on the distal end of each of the separate fins 6b is interposed between the contacting portions 3e of adjacent contacts 3 and contacted with the upper surface of the IC lead 5b under pressure, with a projection forming the contacting portion 3e being allowed to project slightly downwardly from a lower edge of the regulating piece 6c. More specifically, each regulating piece 6c is interposed between adjacent contacting portions 3e at a position near the upper surface of the IC lead 5b and regulates the side surfaces of each contacting portion 3e.

Figure 4A:
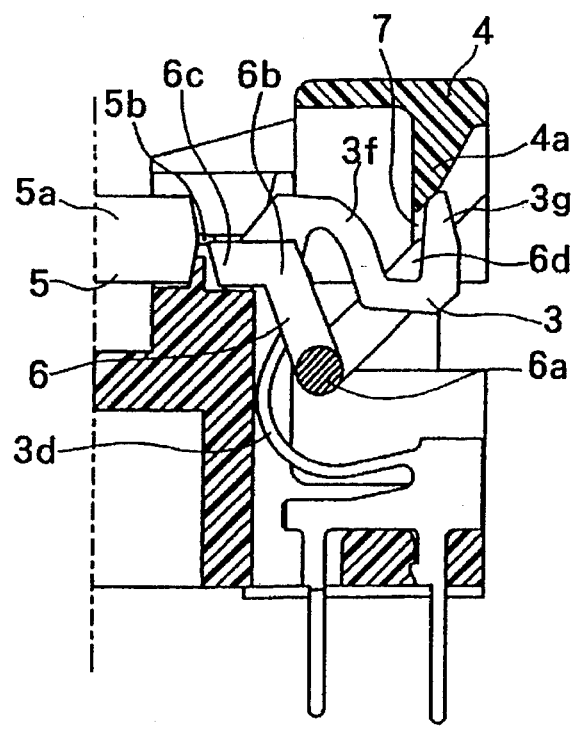
FIGS. 4(A) and 4(B) are partial sectional views showing operating states in an IC socket according to a second embodiment of the present invention.
Figure 4B:
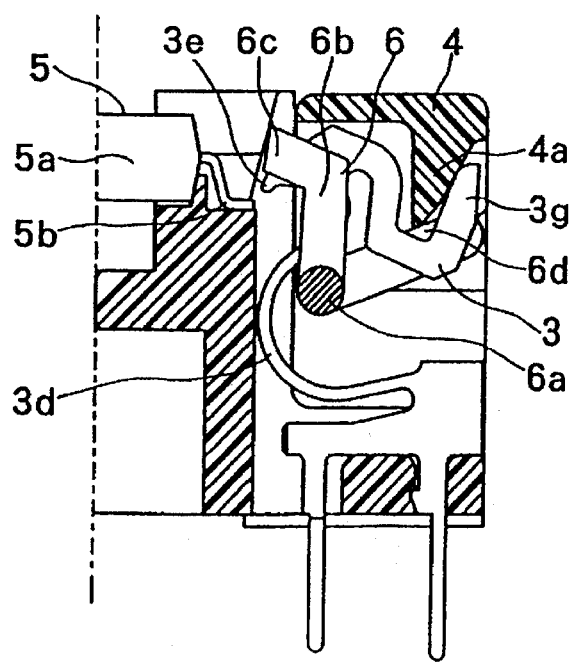

In a second embodiment shown in FIGS. 4(A) and 4(B), each regulating piece 6c, when being displaced forwardly, is interposed between the contacting portions 3e of adjacent contacts 3 and is also interposed between adjacent leads 5b, in order to regulate the side surfaces of the contacting portion 3e and the side surfaces of the IC leads 5b which the contacting portions 3e contact. As a result, relative positions of the contacting portions 3e and the IC leads 5b can be obtained.

Since the construction of the remaining parts of the embodiment of FIG. 4 is the same as that of FIGS. 1 to 3, description thereof is omitted.

In the embodiments of FIGS. 3 and 4, the contact opening/closing cover 4 is normally supported by the contacts 3. In other words, the pressing portion 4a of the opening/closing cover 4 and the pressure receiving portions 3g of the contacts 3 are always moved together, with the pressing portion 4a placed on the pressure receiving portion 3g.

As shown in FIGS. 3(A) and 4(A), the contact regulating levers 6 are disposed opposite to each other with a predetermined space 7, between the pressure receiving arm 6d and the pressing portion 4a.

Owing to the foregoing arrangement, the pressing portion 4a of the contact opening/closing cover 4 initially presses only the pressure receiving portions 3g of the contacts 3 during lowering, and then, after additional lowering, presses the pressure receiving arms 6d as well as the pressure receiving portions 3g.

Accordingly, the contacting portions 3e of the contacts 3 start their rearward displacement first and, thereafter, the regulating pieces 6c of the separate fins 6b start their rearward displacement.

Likewise, during upward movement of the cover 4, the separate fins 6b and regulating pieces 6c are first displaced forwardly into positions (FIG. 3(C)) for regulating the contacting portions 3e of the contacts 3 or into positions (FIG. 4(A)) for regulating both the contacting portions 3e and the IC leads 5b. Then, at a somewhat later time, the contacting portions 3e are brought into contact with the upper surfaces of the IC leads 5b. By doing this, the contacting portions 3e are appropriately guided and correctly positioned relative to the IC leads 5b.

FIGS. 5 to 11 show a third embodiment of the present invention. In this third embodiment, a contact opening/closing lever 8 for displacing the contacting portion 3e of the contact 3 rearwardly is coaxial with the contact regulating lever 6, so that the contacting portion 3e of the contact 3 is displaced rearwardly by the contact opening/closing lever 8, and the contact regulating lever 6 is displaced rearwardly by the contact opening/closing lever 8. That is, the contact regulating lever 6 is displaced rearwardly through the contact opening/closing lever 8 when the contact opening/closing cover 4 is depressed.

As shown in FIG. 5, the contact opening/closing lever 8 extends in parallel relation with the array of contacts 3. The lever 8 has a plurality of through-slits 8b into which the contacts 3 are inserted respectively. The contacting portions 3e of the contacts 3 are allowed to extend outside through the through-slits 8b, respectively.

The slits 8b are opened upwardly and downwardly. The side surfaces of the contacts extending through the slits 8b are regulated by separate walls 8a adapted to separate adjacent slits 8b. A front abutment 8c for each contact 3 is formed by a front wall defining the slits 8b. The contact 3 is resiliently engaged by this front abutment 8c. The contacting portion 3e is displaced upwardly and rearwardly by the front abutment 8c, in accordance with the turning motion of the lever 8.

The contact regulating lever 6 has a plurality of separate fins 6b which are interposed between adjacent contacting portions 3e projecting forwardly from the upper opening of the slit 8b. The contact regulating lever 6 extends in parallel relation with the array of contacts 3 as in the case with the contact opening/closing lever 8. As typically shown in FIG. 7(A1), a slit 6i is formed between adjacent separate fins 6b. The contacting portion 3e of the contact 3 is received in this slit 6i. In other words, the regulating piece 6c of each separate fin 6b is interposed between adjacent contacting portions 3e, and the side surfaces of the contacting portions 3e are regulated by the separate fins 6b. Also, as previously described, the side surfaces of the contacting portions 3e and the side surfaces of the IC leads 5b are regulated by the separate fins 6b.

The contact opening/closing lever 8 and the contact regulating lever 6 are axially supported such that they are turned about the same supporting point. As one example of such an arrangement, as shown in FIG. 5, the contact opening/closing lever has shaft portions 8d projecting from opposite end portions thereof. The separate walls 8a and slits 8b are arranged, side by side, in a direction perpendicular to the axis of the shaft portions 8d.

Figure 6:
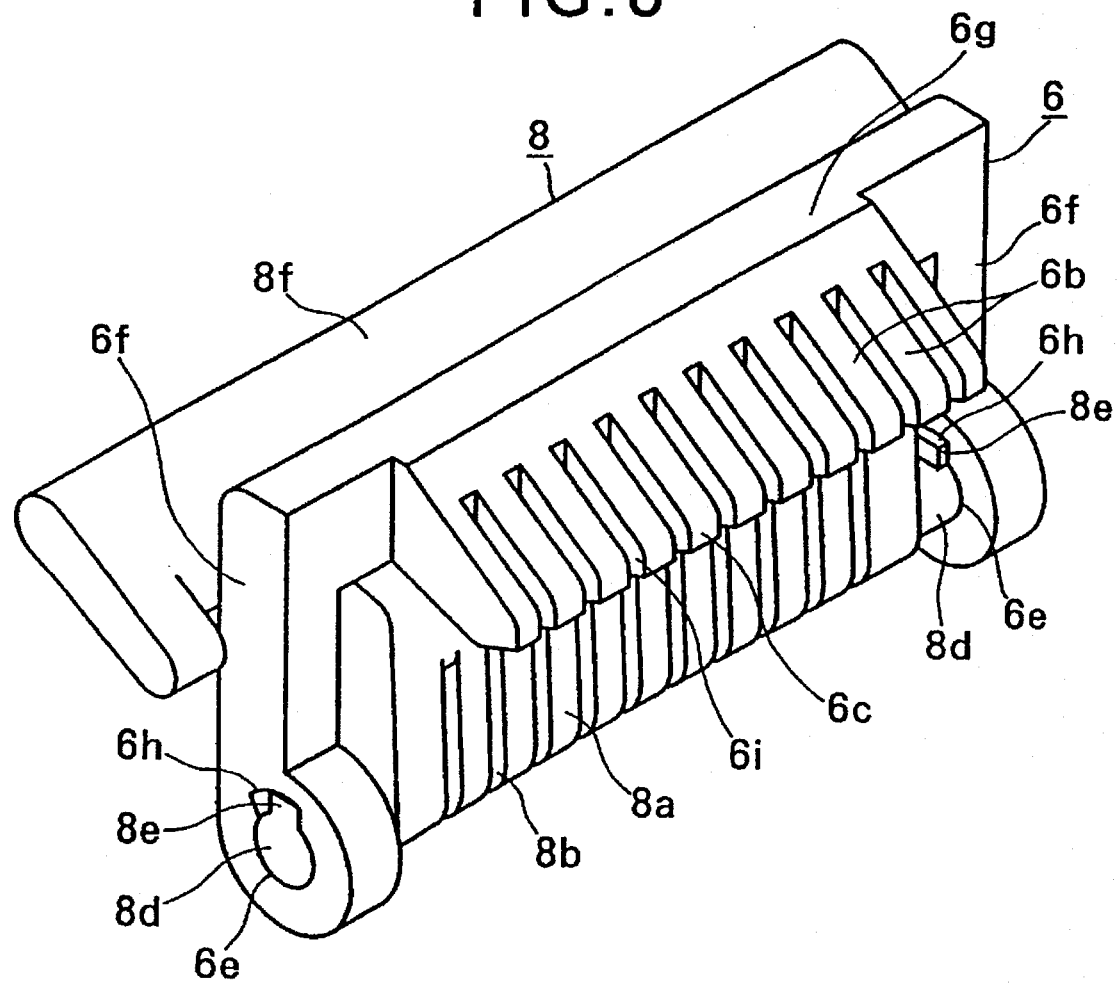
FIG. 6 is an elevational perspective view showing the contact opening/closing lever and the contact regulating lever of FIG. 5 in an assembled state.

Bearing holes 6e are formed in opposite ends of the contact regulating lever 6. As shown in FIG. 6, the shaft portions 8d are slide-fitted in the bearing holes 6e, respectively.

A pair of turnable arms 6f are connected to opposite ends of the contact regulating lever 6. The separate fins 6b are arranged, side by side, on a connection bar 6g for interconnecting first ends of the turnable arms 6f. The bearing holes 6e are formed in the second ends of the turnable arms 6f. The separate fins 6d project in a direction perpendicular to the axis of the bearing holes 6e from the connection bar 6g. The contact regulating lever 6 is interposed between the turnable arms 6f and adapted to slide-fit the shaft portions 8d in the shaft holes 6e.

Owing to the foregoing arrangement, the separate walls 8a and slits 8b of the contact opening/closing lever 8 are in a lower location, whereas the separate fins 6b and slits 6i of the contact opening/closing lever 8 are in an upper location. Both the levers 6 and 8 are axially supported such that they are turned about the same supporting point.

The contact opening/closing lever 8 and contact regulating lever 6 are assembled such that when the lever 8 is turned, the lever 6 is turned. This assembly is rotatably supported by the socket body 1 at the neighborhood of the area where the shaft portions 8d and the shaft holes 6e are slide-fitted.

As means for turning the contact regulating lever 6 when the contact opening/closing lever 8 is turned, the contact opening/closing lever 8 is provided with a key 8e. The key 8e is coaxial with the shaft portion 8d of the lever 8 and projects from a peripheral surface of the shaft portion 8d. On the other hand, a key groove 6h is formed in an inner peripheral surface of the shaft hole 6e of the contact regulating lever 6 as shown in FIG. 6. The key groove 6h is coaxial with the shaft hole 6e. The key 8e is slide-fitted in the key groove 6h. The key groove 6h has a longer dimension in the circumferential direction than the key 8e, and the key 8e is slide-fitted in the key groove 6h such that the key 8e has play within the key groove 6h. To provide such play for the key 8e with respect to the key groove 6h, the pivot stroke of the contact opening/closing lever 8 is made large and the pivot stroke of the contact regulating lever 6 operatively connected to the opening/closing lever 8 is made small. By providing the above-mentioned play, the pivot strokes of the levers 8 and 6 are appropriately set to realize the above-mentioned relation.

On the other hand, the contact opening/closing lever 8 is provided with a pressure receiving bar 8f on that end portion opposite to the end portion on which the shaft portion 8d is disposed. The pressure receiving bar 8f is adapted to connect the separate walls 8a. The pressure receiving bar 8f is placed opposite to the pressing portion 4a of the contact opening/closing cover 4, and the pressing portion 4a is supported on the pressure receiving bar 8f, thereby supporting the cover 4.

The contacts 3 allow upper ends of their curved spring portions 3d to pierce through the slits 8b formed in the separate walls 8a. The contacting portions 3e of the contacts 3 are allowed to project forwardly from the slits 8b while portions of the contacts 3 in the neighborhood of the neck portions of the contacting portions 3e resiliently lean against the front abutment 8c which defines the slits 8b.

FIGS. 7 to 11 show operating states of the IC socket according to the third embodiment of the present invention. FIGS. 7(A1) and 7(A2) show the same operating state, FIG. 7(A1) is a sectional view taken midway along the length of the assembly of the contact opening/closing lever 8 and contact regulating lever 6, and FIG. 7(A2) is a sectional view when the assembly is viewed from the side surface of the shaft portion 8b.

Figure 9:
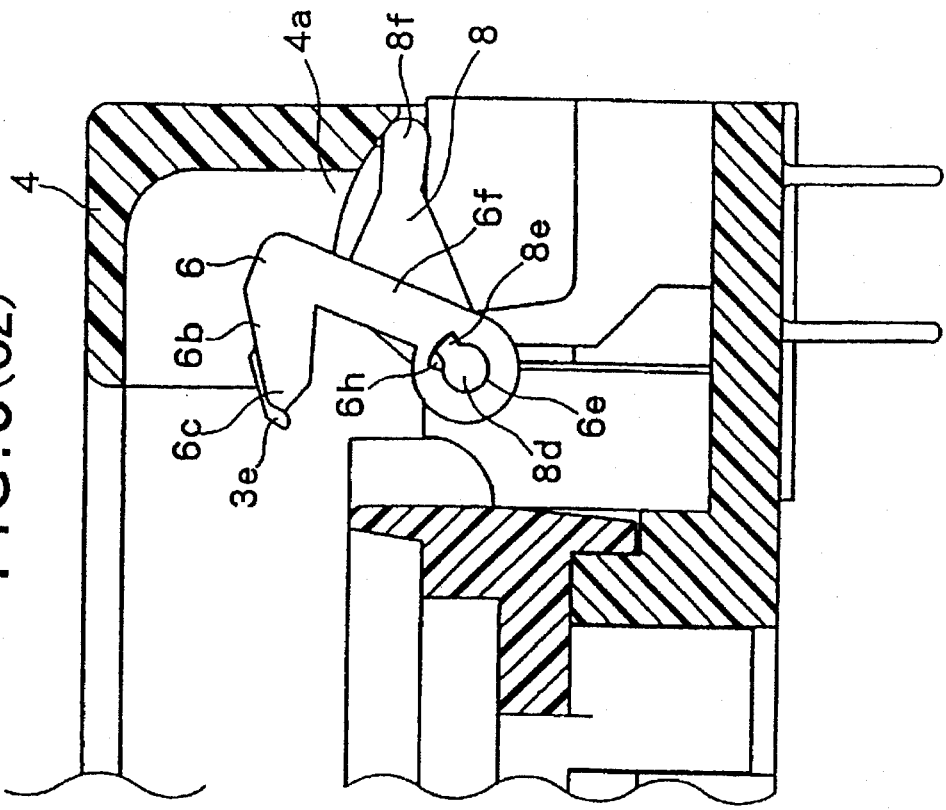
FIG. 9(C1) is a partial sectional view of the IC socket for explaining the operating state which follows that of FIG. 8(B1), and FIG. 9(C2) is a partial sectional view of the IC socket for explaining the operating state which follows that of FIG. 8(B2)
Figure 9:
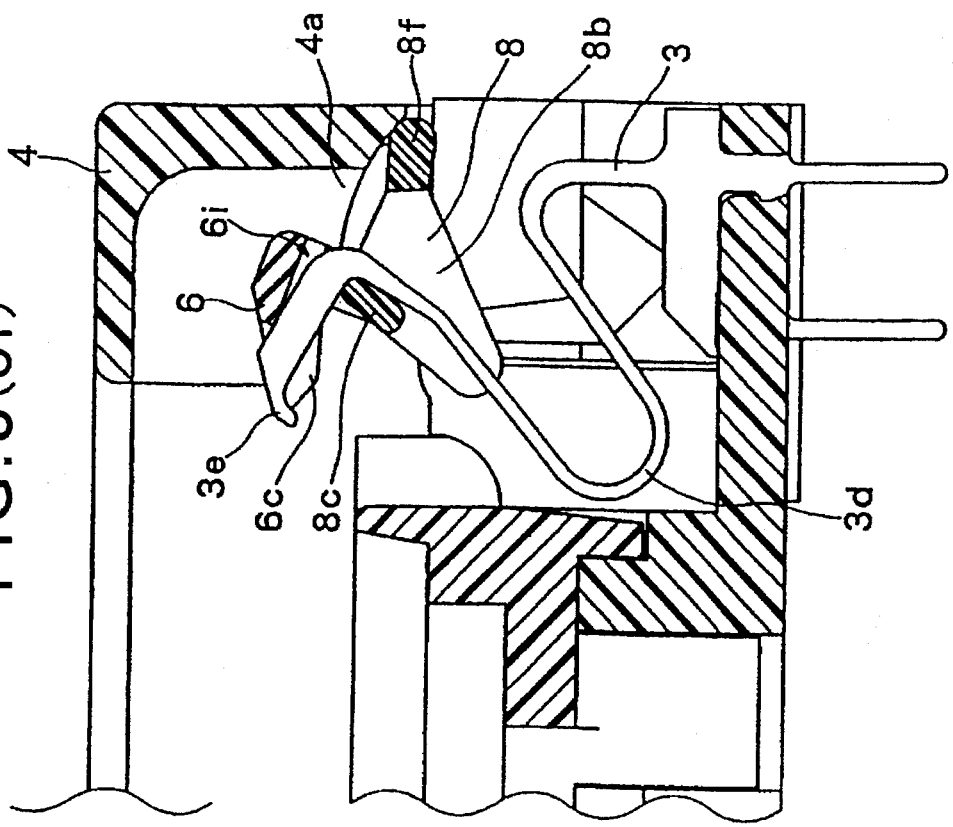

The relations between FIGS. 8(B1) and 8(B2), between FIGS. 9(C1) and 9(C2), between FIGS. 10(D1) and 10(D2) and between FIGS. 11(E1) and 11(E2), are the same as the relation between FIGS. 7(A1) and 7(A2).

As shown in FIGS. 7(A1) and 7(A2) and FIGS. 8(B1) and 8(B)2, when the contact opening/closing cover 4 is depressed from the uppermost standby position, the pressure receiving portion 8f is pushed down by the pressing portion 4a such that the lever 8 is turned downwardly about the shaft 8d and the front abutment BC pulls the upper end of the spring portion 3d. As a consequence, the contacting portion 3e starts the upward and rearward displacement against the resilient force of the spring portion 3d.

Upon initial pivoting of the contact opening/closing lever 8, the contact regulating lever 6 does not pivot, but rather stays in the forwardly displaced position. Specifically, as shown in FIG. 7(A2), play exists between the key 8e and a rear wall of the key groove 6h. The contact opening/closing lever 8 is turned downwardly alone until the key 8e is brought into abutment with the rear wall of the key groove 6h after the lever 8 starts turning downwardly. During that time, the contact regulating lever 6 is held still.

Next, as shown in FIGS. 9(C1), 9(C2) and FIGS. 10(D1) and 10(D2), the contact opening/closing cover 4 is further depressed to pivot the contact opening/closing lever 8 further downwardly. Then, the key 8e hits the rear wall of the key groove 6h to push it rearwardly. As a consequence, the contact regulating lever 6 starts pivoting rearwardly about the shaft 8d to displace the separate fins 6b upwardly and rearwardly.

As shown in FIGS. 10(D1) and 10(D2), the IC package 5 is loaded in the IC receiving portion 2 with the contacting portions 3e of the contacts 3 and the separate fins 6b of the lever 6 maintained outside of the IC receiving portion 2. This loading state is the same as in FIG. 3(B).

When the depressing force against the contact opening/closing cover 4 is removed, a pressing force is applied to the front abutment 8c by a restoring force of the spring portions 3d of the contacts 3 and the contact opening/closing lever 8 is pivoted upwardly, as shown in FIGS. 11(E1) and 11(E2). Then, in accordance with the forward (upward) pivoting of the contact opening/closing lever 8, the contacting portions 3e of the contacts 3 are moved downwardly and forwardly by the restoring force of the spring portions 3d and the keys 8e push the front walls of the key grooves 6h to pivot the contact regulating lever 6 downwardly and forwardly.

As a consequence, the regulating piece 6c of each separate fin 6b is interposed between adjacent contacting portions 3e, so that each contacting portion 3e is brought into contact with the upper surface of the IC lead 5b under pressure while regulating the side surfaces of each contacting portion 3e with the regulating piece 6c.

As shown in FIGS. 4(A) and 4(B), each separate fin 6b is interposed between adjacent IC leads 5b, so that the individual contacting portions 3e and the individual leads 5b can be correctly positioned.

FIGS. 12(A1) and 12(A2) show a fourth embodiment of the present invention. As shown in the Figures, when the IC package 5 is received in the IC receiving portion 2, the basal portion of the IC leads 5b are supported on the rib 13 with the distal ends of the IC leads 5b freely projected outwardly of the rib 13.

On the other hand, the contacting portions 3e are brought into pressure contact with the upper surfaces of the basal portions of the IC leads 5b supported on the rib 13. Each separate fin 6b is interposed between adjacent leads 5b in the area outwardly of the rib 13 and also interposed in the neighborhood between adjacent contacting portions 3e, so that both the contacting portions 3e and leads 5b are correctly positioned. Other specific constructions of the fourth embodiment can employ the constructions shown in the first to third embodiments.

FIGS. 13 and 14 show another embodiment, in which the contact regulating lever 6 shown in the third and fourth embodiments is held by a spring 12 or 12', so that the position before the backward turning is caused by means of depression of the cover 4 is held as a predetermined position.

FIG. 13 shows an example in which the spring 12 and the contact regulating lever 6 are integrally formed of a synthetic resin, whereas FIG. 14 shows an example, in which the lever 6 is resiliently held by a coil spring 12' or the like, separately situated.

According to the present invention, when each contact is displaced forwardly from the contact-relation removing position to the contacting position, the positioning member is displaced forwardly so that the portion of the contact in the neighborhood of the contacting portion is correctly positioned by the positioning member interposed between the contacting portions of adjacent contacts, thereby ensuring a correct electrical connection between the contacts and the leads of the IC package.

Having thus described the present invention, many modifications thereto will become apparent to those skilled in the art to which it pertains without departing from the scope and spirit of the present invention as defined in the appended claims.

What is claimed is:

1. An IC socket for use with an IC package having an IC body and IC leads, said IC socket comprising:

a socket body having an IC package receiving portion;

a plurality of contacts mounted to said socket body and arranged in array along said IC package receiving portion of said socket body, each of said contacts including a spring portion and a projecting contacting portion supported by said spring portion so as to be movable between an IC lead contacting position and an IC lead non-contacting position, said IC lead non-contacting position being spaced outwardly of said IC lead contacting position from said IC package receiving portion;

a contact opening/closing cover, mounted over said socket body for movement between a raised position and a lowered position relative thereto, for causing movement of said contacting portions of said contacts from said IC contacting positions to said IC non-contacting positions;

a positioning member movably mounted to said socket body for movement between a first position and a second position spaced outwardly of said first position from said IC package receiving portion, said positioning member comprising a plurality of spaced apart regulating pieces, each of which is interposed between respective contacting portions of an adjacent pair of said contacts when said positioning member is in said first position;

wherein said positioning member further includes a plurality of spaced apart fins extending outwardly from said positioning member, said regulating pieces being respectively mounted at distal ends of said fins; and wherein each of said fins is interposed between an adjacent pair of said contacts.

2. An IC socket as recited in claim 1, wherein
   said contact opening/closing cover is further operable, upon being moved from said raised position to said lowered position, for causing movement of said positioning member from said first position to said second position.

3. An IC socket as recited in claim 2, wherein
   said contact opening/closing cover includes a downwardly depending pressing portion which engages both said contacts and said positioning member for causing the movement of said positioning member from said first position to said second position and for causing the movement of said contacting portions of said contacts from said IC contacting positions to said IC non-contacting positions, upon movement of said contact opening/closing cover from said raised position to said lowered position.

4. An IC socket as recited in claim 1, wherein
   said positioning member is pivotally mounted to said socket body.

5. An IC socket as recited in claim 1, wherein
   said positioning member includes a pivot shaft mounted to said socket body for pivotally mounting said positioning member to said socket body.

6. An IC socket as recited in claim 1, wherein
   for each of said contacts, said spring portion constitutes a means for moving said contacting portion downwardly and inwardly toward said IC package receiving portion from said IC lead non-contacting position to said IC lead contacting position, upon movement of said contact opening/closing cover from said lowered position to said raised position.

7. An IC socket for use with an IC package having an IC body and IC leads, said IC socket comprising;

a socket body having an IC package receiving portion adapted to receive the IC package;

a plurality of contacts mounted to said socket body and arranged in array along said IC package receiving portion of said socket body, each of said contacts including a spring portion and a projecting contacting portion supported by said spring portion so as to be movable between an IC lead contacting position and an IC lead non-contacting position, said IC lead non-contacting position being spaced outwardly of said IC lead contacting position from said IC package receiving portion, said contacting portions of said contacts being respectively aligned and contacted with the IC leads of the IC package when the IC is disposed in said IC package receiving portion and said contacting portions are disposed in their IC lead contacting positions;

a contact opening/closing cover, mounted over said socket body for movement between a raised position and a lowered position relative thereto, for causing movement of said contacting portions of said contacts from said IC contacting positions to said IC non-contacting positions; and a positioning member movably mounted to said socket body for movement between a first position and a second position spaced outwardly of said first position from said IC package receiving portion, said positioning member comprising a plurality of spaced apart regulating pieces, each of which is positioned so as to be interposed directly in a space between an adjacent pair of the IC leads of the IC package when the IC package is received in said IC package receiving portion and said positioning member is in said first position so as to regulate the positions of the IC leads for alignment with said contacts, respectively.

8. An IC socket as recited in claim 7, wherein said positioning member further includes a plurality of spaced apart fins, said regulating pieces being respectively mounted at distal ends of said fins; and each of said fins is interposed between an adjacent pair of said contacts.

9. An IC socket as recited in claim 7, wherein said contact opening/closing cover is further operable, upon being moved from said raised position to said lowered position, for causing movement of said positioning member from said first position to said second position.

10. An IC socket as recited in claim 9, wherein said contact opening/closing cover includes a downwardly depending pressing portion which engages both said contacts and said positioning member for causing the movement of said positioning member from said first position to said second position and for causing the movement of said contacting portions of said contacts from said IC contacting positions to said IC non-contacting positions, upon movement of said contact opening/closing cover from said raised position to said lowered position.

11. An IC socket as recited in claim 7, wherein said positioning member is pivotally mounted to said socket body.

12. An IC socket as recited in claim 7, wherein said positioning member includes a pivot shaft mounted to said socket body for pivotally mounting said positioning member to said socket body.

13. An IC socket as recited in claim 7, wherein for each of said contacts, said spring portion constitutes a means for moving said contacting portion downwardly and inwardly toward said IC package receiving portion from said IC lead non-contacting position to said IC lead contacting position, upon movement of said contact opening/closing cover from said lowered position to said raised position.

14. An IC socket for use with an IC package having an IC body and IC leads, said IC socket comprising:

a socket body having an IC package receiving portion adapted to receive the IC package;

a plurality of contacts mounted to said socket body and arranged in array along said IC package receiving portion of said socket body, each of said contacts including a spring portion and a projecting contacting portion supported by said spring portion so as to be movable between an IC lead contacting position and an IC lead non-contacting position, said IC lead non-contacting position being spaced outwardly of said IC lead contacting position form said IC package receiving portion, said contacting portions of said contacts being respectively aligned and contacted with the IC leads of the IC package when the IC is disposed in said IC package receiving portion and said contacting portions are disposed in their IC lead contacting positions;

a contact opening/closing cover, mounted over said socket body for movement between a raised position and a lowered position relative thereto, for causing movement of said contacting portions of said contacts from said IC contacting positions to said IC non-contacting positions; and a positioning member movably mounted to said socket body for movement between a first position and a second position spaced outwardly of said first position from said IC package receiving portion, said positioning member comprising a plurality of spaced apart regulating pieces, each of which is positioned so as to be interposed directly in a space between an adjacent pair of the IC leads of the IC package and between an adjacent pair of said contacting portions respectively aligned with the adjacent pair of the IC leads when the IC package is received in said IC package receiving portion and said positioning member is in said first portion so as to regulate the positions of the IC leads for alignment with said contacts, respectively.

15. An IC socket as recited in claim 14, wherein said positioning member further includes a plurality of spaced apart fins, said regulating pieces being respectively mounted at distal ends of said fins; and each of said fins is interposed between an adjacent pair of said contacts.

16. An IC socket as recited in claim 14, wherein said contact opening/closing cover is further operable, upon being moved from said raised position to said lowered position, for causing movement of said positioning member from said first position to said second position.

17. An IC socket as recited in claim 16, wherein said contact opening/closing cover includes a downwardly depending pressing portion which engages both said contacts and said positioning member for causing the movement of said positioning member from said first position to said second position and for causing the movement of said contacting portions of said contacts from said IC contacting positions to said IC non-contacting positions, upon movement of said contact opening/closing cover from said raised position to said lowered position.

18. An IC socket as recited in claim 14, wherein said positioning member is pivotally mounted to said socket body.

19. An IC socket as recited in claim 14, wherein said positioning member includes a pivot shaft mounted to said socket body for pivotally mounting said positioning member to said socket body.

20. An IC socket as recited in claim 14, wherein for each of said contacts, said spring portion constitutes a means for moving said contacting portion downwardly and inwardly toward said IC package receiving portion from said IC lead non-contacting position to said IC lead contacting position, upon movement of said contact opening/closing cover from said lowered position to said raised position.

* * * * *